(12) United States Patent
Sakamoto et al.

(10) Patent No.: US 6,259,157 B1
(45) Date of Patent: Jul. 10, 2001

(54) HYBRID INTEGRATED CIRCUIT DEVICE, AND METHOD OF MANUFACTURING THEREOF

(75) Inventors: Noriaki Sakamoto; Hidefumi Saito; Toshimichi Naruse; Hisashi Shimizu, all of Gunma (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/188,717

(22) Filed: Nov. 10, 1998

(30) Foreign Application Priority Data

Mar. 11, 1998 (JP) .................................. 10-059944
Mar. 17, 1998 (JP) .................................. 10-067331
Mar. 17, 1998 (JP) .................................. 10-067332
May 28, 1998 (JP) .................................. 10-147386

(51) Int. Cl.[7] .................................................. H01L 23/34
(52) U.S. Cl. ........................................... 257/723; 257/706
(58) Field of Search .................................... 257/787, 723, 257/706, 705

(56) References Cited

U.S. PATENT DOCUMENTS 5,675,181 * 10/1997 Nishiura et al. ..................... 257/705
6,087,721 * 7/2000 Akhnoukh et al. .................. 257/705

FOREIGN PATENT DOCUMENTS 10-26934   1/1998  (JP) .

\* cited by examiner

*Primary Examiner*—Roy Potter
(74) *Attorney, Agent, or Firm*—Armstrong, Westerman, Hattori, McLeland & Naughton, LLP

(57) ABSTRACT

A hybrid integrated circuit device comprising: a substrate having an insulated surface and superior thermal conductivity; conductor patterns provided on the substrate; an element mounted on the surface so as to connect with the conductor patterns through electrically connecting means; an outer read which is electrically connected to the conductor patterns and is extended to the outside; and a sealing member of thermoplastic resin so as to be molded and cover at least the surface of the substrate.

16 Claims, 8 Drawing Sheets

HYBRID INTEGRATED CIRCUIT DEVICE, AND METHOD OF MANUFACTURING THEREOF

BACKGROUND OF THE INVENTION

1. Field of the Invention

The present invention relates to a hybrid integrated circuit device, and more particularly, to a hybrid integrated circuit device employing thermoplastic resin which sets within a short period of time, as well as to a method of manufacturing the hybrid integrated circuit device.

2. Description of the Related Art

In general, there are primarily two types of methods employed to seal a hybrid integrated circuit device in a resin package. One type of method is to seal a hybrid integrated circuit board having circuit elements, such as semiconductor elements, mounted thereon with a cap which is generally called a casing material. This sealing structure comprises a hollow structure or a resin-filled structure.

Another type of sealing method is a transfer molding method which is famous as a method of molding a semiconductor integrated circuit. The transfer molding method usually employs thermosetting resin. Under this method, a mold is heated to about 180° C., and the thermosetting resin is set while being maintained at 180° C. (hereinafter representing a phenomenon in which thermosetting resin is polymerized and solidified through thermal reaction) The thus-set mold(die) is removed from the mold, thereby completing a sealed semiconductor integrated circuit. Since solder used for mounting the circuit elements on the board is usually solder whose fusing temperature is high (hereinafter representing high temperature solder), the solder does not pose a problem such as fusing of solder.

However, a sealing structure using a casing material requires a margin to be ensured on a substrate in order to prevent the casing material from coming into contact with circuit elements provided in the casing material, thereby resulting in an increase in the outer dimension of the hybrid integrated circuit.

In contrast, as can be seen from the foregoing description, the transfer molding method requires a long period of time to set the thermosetting resin by application of heat to the resin. Consequently, it is impossible to improve the productivity of thermosetting resin.

The inventors of the present patent application took note of thermoplastic resin which does not require much time to set. The thermoplastic resin does not set and becomes fused when subjected to application of heat. Further, when being cooled, the thus-fused thermoplastic resin becomes solidified (hereinafter representing a phenomenon in which the thermoplastic resin is solidified without involving reaction). Accordingly, after molding of a hybrid integrated circuit, the thus-molded circuit is cooled, thus solidifying the thermoplastic resin. In this way, the hybrid integrated circuit can be sealed within a short period of time. However, in a case where a hybrid integrated circuit is sealed with thermoplastic resin through, e.g., injection molding, the thermoplastic resin is filled into the mold at a high temperature, e.g., a temperature of about 300° C. As a result, the solder is fused, which in turn causes failures in electrical connection among the circuit elements mounted on the hybrid integrated circuit board.

To prevent this problem, it is only required to use high-temperature solder. However, in terms of prevention of deterioration insulating resin under a conductor pattern, low-temperature solder whose fusing temperature is low (hereinafter representing low temperature solder)is preferable. The present invention will now be described, provided that manufacturing an integrated circuit device using a solder which is fused at a temperature ranging from about 180 to 250° C.

It is preferable to use a substrate having superior thermal conduction such as a metal substrate. However, in a case where such a metal substrate is used, the reverse side of the hybrid integrated circuit substrate becomes exposed, thereby posing a problem associated with insulation between the hybrid integrated circuit substrate and a chassis (a frame on which the hybrid integrated circuit device is mounted). Further, there is a problem associated with the moisture resistance of the hybrid integrated circuit: namely, entry of moisture into the hybrid integrated circuit substrate from a boundary surface between the exposed reverse side of the hybrid integrated circuit board and thermoplastic resin provided around the reverse side.

If a substrate having inferior thermal conduction, e.g., a printed board, a flexible sheet, a glass substrate, or a ceramic substrate, is used, solder is fused.

Further, in the case of full-molding of a hybrid integrated circuit through use of a transfer molding method, resin penetrates to the reverse side of an island of a lead frame. To this end, a gap is ensured between the reverse side of the island on which a chip is mounted and a mold, through use of pins or by the mold pinching the lead frame. However, under an injection molding method, thermoplastic resin is squirted at a pressure which is as high as 50 to 200 Kg/cm$^2$. As a result, the lead frame becomes warped, or bonding wires are broken. A similar problem may arise not only in a lead frame but also in a hybrid integrated circuit board such as a metal board or a printed board.

The present invention has been conceived to solve the foregoing drawbacks of the prior art.

SUMMARY OF THE INVENTION

A first object of the present invention is to provide a hybrid integrated circuit device useable a low temperature solder.

A second object of the present invention is to provide a hybrid integrated circuit device having a high moisture resistance.

A third object of the present invention is to provide a hybrid integrated circuit device be able to be manufactured easily and firstly.

According to a first aspect of the present invention, a hybrid integrated circuit is molded with thermoplastic resin, through use of a metal substrate or a substrate having superior heat conductivity which prevents an increase in the surface temperature of the substrate by dissipation, to the outside of the circuit, of the heat of injected mold or by collection of the heat into a heat sink.

According to a second aspect of the present invention, circuit elements electrically connected to a hybrid integrated circuit board by way of solder are potted with protective resin for heat protection purpose.

According to a third aspect of the present invention, epoxy resin is used as a protective resin. If epoxy resin is adopted as thermoplastic resin for thermal protection purpose, slippage arises between the thermoplastic resin and fine metal wires because of an inferior adhesive property of the thermoplastic resin and warpage in the substrate, thus resulting in a break in a wiring pattern. In contrast, if resin having a superior adhesive property, e.g., epoxy resin, is used, slippage can be prevented.

According to a fourth aspect of the present invention, the protective resin is provided with a coefficient of thermal expansion which is substantially equal to that of the hybrid integrated circuit board.

According to a fifth aspect of the present invention, protective resin is applied over substantially the entire surface of the hybrid integrated circuit board, and the hybrid integrated circuit board is sealed with the thermoplastic resin so as to cover the protective resin.

According to a sixth aspect of the present invention, a metal substrate is used as the hybrid integrated circuit board in order to dissipate or store the heat of the thermoplastic resin injected to mold the hybrid integrated circuit board connected to circuit elements by way of solder, thereby preventing fusing of solder.

According to a seventh aspect of the present invention, the thermoplastic resin mixed with reinforced fibers is filled into the hybrid integrated circuit board along the horizontal direction of the hybrid integrated circuit board, thus preventing warpage from arising in the horizontal direction.

According to an eighth aspect of the present invention, the hybrid integrated circuit board is sealed with thermoplastic resin in such a way that an exposed portion of a support member made of thermoplastic resin is fused and becomes integrated with the hybrid integrated circuit board.

As mentioned previously, thermoplastic resin is fused at a certain temperature and becomes solidified when being cooled. Accordingly, the support member—which is made of thermoplastic resin and is provided in a mold beforehand—is fused and integrated with the hybrid integrated circuit board when undergoing the heat of the thermoplastic resin filled into the hybrid integrated circuit board. As a result, the hybrid integrated circuit board is molded and integrated with the support member by means of the thermoplastic resin filled into the hybrid integrated circuit board. The reverse side of the substrate can be covered with the thermoplastic resin, thereby improving the withstand voltage characteristics and moisture resistance of the hybrid integrated circuit board.

According to a ninth aspect of the present invention, there is provided a hybrid integrated circuit board comprising:
- a support member which has at least stoppers along opposing side surfaces of the support member or a groove for the purpose of locking a substrate and which is made of thermoplastic resin;
- a hybrid integrated circuit board which is locked by the groove or the stoppers and which has semiconductor elements and/or passive elements electrically connected to conductor patterns provided on the surface of the hybrid integrated circuit board; and
- a sealing member which is formed from thermoplastic resin and which is in contact with the support member, wherein the contacted portion of the sealing member is fused and integrated with the support member so as to substantially seal the hybrid integrated circuit board when the thermoplastic resin is molded in a mold.

For example, in the case of PPS resin, the thermoplastic resin is injected into the mold at a pressure of about 50 to 200 Kg/cm$^2$. Since the support member has stoppers, the displacement of the hybrid integrated circuit board, which would otherwise be caused by injection of resin, can be prevented.

According to a tenth aspect of the present invention, the semiconductor element and/or the passive element is connected to the conductor pattern by means of solder, and insulating resin is applied to the surface of the solder.

Although the thermoplastic resin is fused as high as about 300° C., the insulating resin applied to the solder prevents direct transfer of the fused thermoplastic resin, thereby preventing fusing of the solder.

According to an eleventh aspect of the present invention, the hybrid integrated circuit device comprises an outer lead to be connected to the conductor pattern by way of solder, and application of the insulating resin to the solder is omitted and remained uncovered with the insulating resin.

As will be described later, the outer lead acts as a radiating fin and prevents an increase in the temperature of solder, thereby omitting the application of the insulating resin to solder and hence simplifying the manufacturing processes.

According to a twelfth aspect of the present invention, exposed portions of the solder and/or the fine metal wire which electrically connect the semiconductor element and/or the passive element are (or is) covered with epoxy resin, and the thermoplastic resin mixed with reinforced fibers is filled into the horizontal direction of the hybrid integrated circuit board. The epoxy resin prevents transfer of heat from the injected resin directly to solder, thereby preventing fusing of solder. Further, the bonding characteristic of the epoxy resin prevents the fine metal wire from being slipped. Further, the reinforced fibers are arranged in the horizontal direction of the hybrid integrated circuit board, thereby preventing warpage in the substrate and a break in the fine metal wires.

According to a thirteenth aspect of the present invention, a step for engaging with a sealing member is provided along the periphery of the reverse side of a support member, and warpage prevention means is provided along the step.

As a result, the reverse side of the hybrid integrated circuit board is covered with the support member while warpage in the support member is prevented by means of the warpage prevention means, for example projections, and thermoplastic resin filled into the hybrid integrated circuit penetrates into the reverse side without fail.

According to a fourteenth aspect of the present invention, projecting warpage-prevention means is provided on the step along the entire periphery of the reverse side of the support member.

According to a fifteenth aspect of the present invention, the hybrid integrated circuit device comprising:
- a support member which has a hybrid integrated circuit board mounted thereon, has a step on the reverse side thereof, is formed from thermoplastic resin, and holds one of molds while the support member is in contact with the projection provided on the step, wherein fused thermoplastic resin is filled into a space between a pair of molds, and the portion of the support member which is in contact with the projection is fused by means of the heat of the fused thermoplastic resin, thereby integrally molding the hybrid integrated circuit board.

According to a sixteenth aspect of the present invention, stopper means is provided along the sides of the support member. The inside portion of the stopper means locks the hybrid integrated circuit board, and the outer portion of the stopper means comes into contact with the molds.

Since the fused thermoplastic resin is injected at a high pressure, the stopper means provided on the support member enables the hybrid integrated circuit board to be integrally molded while holding the same.

According to a seventeenth aspect of the present invention, the stopper means is configured so as to come into line or point contact with the mold.

According to an eighteenth aspect of the present invention, the portion of the stopper means facing the mold is provided with a triangular or trapezoidal cross section.

Figure 10:
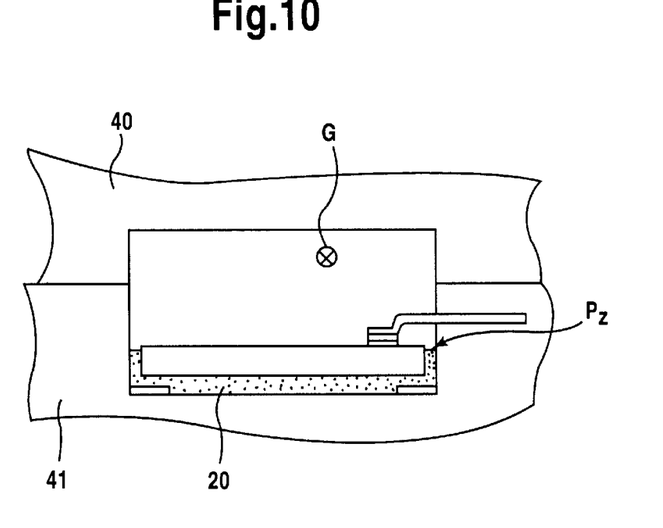
FIG. 10 is a fragmentary cross-sectional view for describing molds when the support member and the hybrid integrated circuit board shown in FIG. 9 are placed in the molds.

When the hybrid integrated circuit board is integrally molded with the support member, there is produced boundary surface P1 (or moisture path P1) between the support member and injected thermoplastic resin (see FIG. 10). In view of moisture resistance, the hybrid integrated circuit board suffers a problem of entry of moisture. In contrast, when the stopper means is brought into substantially line or point contact with the mold, there is produced path P2 (see FIG. 10), thereby improving the moisture resistance of the hybrid integrated circuit board.

DETAILED DESCRIPTION OF THE PREFERRED EMBODIMENTS

First Embodiment

Figure 1:
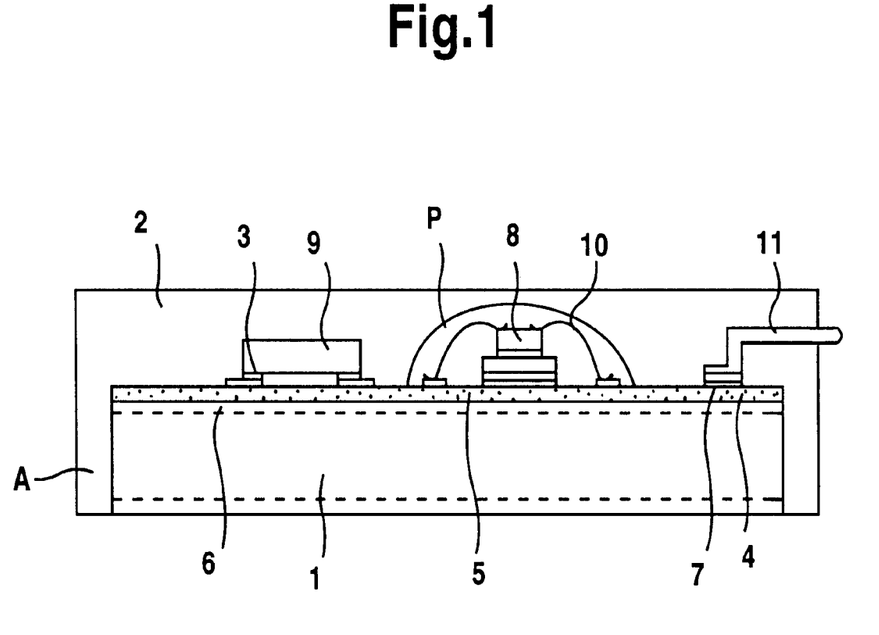
FIG. 1 is a cross-sectional view showing a hybrid integrated circuit device according to a first embodiment of the present invention.

A hybrid integrated circuit device according to a first embodiment of the present invention will be described hereinbelow by reference to FIG. 1.

A metal substrate or an insulating substrate—whose thermal conductivity is close to that of the metal substrate—is employed for a hybrid integrated circuit board 1 characterizing the present invention. The reason for this will be described in detail later. Since thermoplastic resin 2 employed in the present invention is injected at a high temperature, the temperature of the substrate increases during the course of a sealing process. For example, if a metal substrate is employed, the substrate has superior transfer of heat to the outside of the substrate and hence acts as a heat sink. Consequently, the metal substrate prevents an increase in the temperature of the hybrid integrated circuit board 1 and fusing of solder joints 3 and 4.

A substrate made of Cu, Fe, Al, or metal compound having superior conductivity can be used as a metal substrate. Further a substrate made of an insulating material such as BN, having superior conductivity can be used as a substrate. The following explanation describes the embodiment while using an Al substrate.

The surface of the Al substrate 1 is anodized to form an Al oxide, and resin 5 having a superior insulating characteristic is formed on the entire surface of the Al substrate 1 covered with the Al oxide. According to forming the Al oxide, a withstand voltage is improved. If there is no need to take into account a withstand voltage, the Al(metal) oxide may be omitted.

Conductor patterns 6 and 7 are formed from, e.g. Cu., on the resin 5. Further, an active element 8, such as a transistor or an IC, and passive elements 9, such as chip resistors or chip capacitors, are mounted on the conductor patterns 6 and 7 by way of solder, thereby implementing a given circuit. Portions of the elements may be electrically connected by means of a silver paste instead of solder. Further, in a case where the active element 8 is mounted on the substrate 1 so as to be facing up, the element 8 is connected to the conductor patterns 6 and 7 through fine metal wires 10 by way of wire bonding method. Further, outer leads 11 are connected to the substrate 1 by way of the solder joint 4 until they project outside of the thermoplastic resin 2.

The thermoplastic resin 2 for sealing purpose is formed by, e.g., injection molding, and is injected at a very high temperature of about 300° C. In a case where the hybrid integrated circuit board 1 having circuit elements mounted thereon by solder is inserted into molds and is integrally molded, the solder may be fused by the high-temperature resin, which in turn cause solder failures. Particularly, such a problem noticeably arises in a substrate having a low thermal conductivity, such as a resin-based printed board. In contrast, a substrate having a high thermal conductivity is employed in the present invention, the substrate has superior heat dissipation characteristics and acts as a heat sink. Consequently, the substrate prevents an increase in the surface temperature of the substrate, thereby eliminating a problem such as that mentioned above. In the present invention, a material called polyphenylene sulfide (PPS) is used as the thermoplastic resin. The Al substrate is formed to a thickness of 1.5 mm.

The temperature of the molds is considerably lower than that of molds used for transfer molding. More specifically, the molds has a temperature of about 150° C. or less. When liquid resin having a temperature of 300° C. is poured (injected) into the molds, the resin is quickly cooled by means of the molds having a lower temperature. It takes about 10 to 20 seconds or thereabouts to cool the resin. The thermoplastic resin is cured at 280±20° C. Compared with a time period required for transfer molding (e.g., 30 to 180 seconds), the time period can be considerably reduced.

In a case where the hybrid integrated circuit board 1 having circuit elements mounted thereon is molded with the thermoplastic resin 2, the solder joins 3 and 4, bonding wires, and a bare chip should preferably be potted beforehand by means of thermosetting resin P(e.g., epoxy resin). Preferably, the thermosetting resin has the same coefficient of thermal expansion as that of the hybrid integrated circuit board 1.

The foregoing countermeasures have the effect of particularly preventing tilting of fine wires (having a diameter of less than 100 μm) under the pressure at which the hybrid integrated circuit board 1 is molded with thermoplastic resin through injection molding, as well as the effect of preventing a break in the wires. The thermoplastic resin 2 is brought solely into close contact with the hybrid integrated circuit board after molding of the board and does not adhesively react with the substrate 1. Therefore, when the thermoplastic resin 2 is in direct contact with the circuit elements, thermal shock causes stress in solder joins and wire joints including fine and thick wires, because of a mismatch of thermal expansion coefficient between the thermoplastic resin 2 and the components 8 and 9 mounted on the hybrid integrated substrate 1 and a mismatch of thermal expansion coefficient between the hybrid integrated substrate 1 and the thermoplastic resin 2, thereby causing a break in wires. These problems can be solved by means of the potting resin P. Preferably, the potting resin P is thermosetting epoxy resin, and thermoplastic resin is not preferable as the potting resin.- As mentioned previously, the thermoplastic resin is mechanically solely in close contact with the hybrid integrated circuit board and is not chemically bonded to a material to be sealed. If the substrate becomes warped by means of, e.g., thermal shock, and the wires are pulled, the wires cause slippage and result in a break, because the wires do no react with the material to be sealed. However, resin, such as epoxy resin, which reacts with a material to be sealed adhesively is bonded to wires, a substrate, and insulating resin through reaction, so that wires do not cause slippage in the epoxy resin. Further, thermoplastic resin does not directly come into contact with solder during molding operations, and hence an increase in the temperature of solder can be prevented.

There is a phenomenon in which that solder joins of the outer leads 11 do not cause any failures as a result of a heating operation even when resin is not potted, but the cause of the phenomenon is unknown. This phenomenon is considered to be attributable to that, as a result of transfer of heat to the outside of the outer leads, solder is prevented from being fused, that L-shaped engagement of resin with the substrate in area A prevents the displacement of resin from the substrate, or that the outer leads have the effect of preventing removal of resin (i.e., an anchoring effect). More specifically, in a case where joints, bonding wires, and a bare chip are partially potted, potting of leads may be omitted by virtue of the foregoing effect. However, as shown in FIG. 4, in a case where resin is applied to the entire surface of the substrate, potting may not be omitted in terms of workability.

Figure 15A:
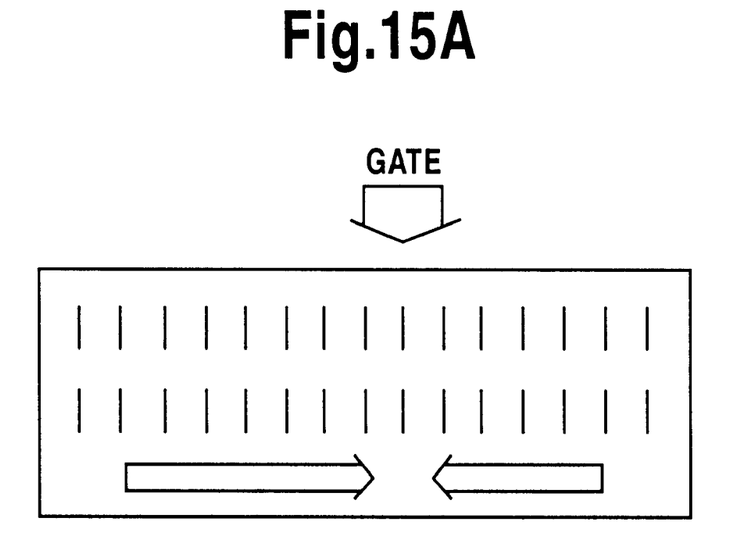
FIGS. 15A and 15B are schematic representations for describing the orientations in which glass fibers are substantially mixed into sealing resin.
Figure 15B:
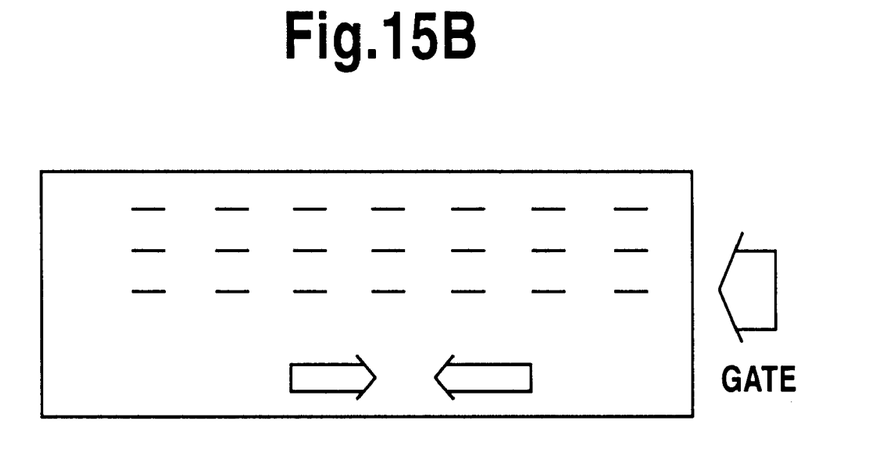

In a case where glass fibers are mixed into liquid resin and where the hybrid integrated circuit board is molded with the resin through injection molding, the orientation of a gate in which molten resin is injected becomes vital. More specifically, in the case of a laterally-elongated substrate such as that shown in FIGS. 15A and 15B, there is a need to form a gate in a shorter side (i.e., in a right-side or left-side side) shown in FIG. 15B, as well as to pour resin in the direction designated by arrows. If fibers are arranged at right angles to the longer side of the gate as shown in FIG. 15A, resin greatly expands and contracts. In contrast, if fibers are arranged parallel to the longer side, resin contracts and expands little. Particularly in the case of thermoplastic resin, since the resin is injected at a high temperature, a warpage in the substrate or the hybrid integrated circuit can be effectively prevented by the injection method as shown in FIG. 15B. This applies to all the embodiments of the present invention.

Figure 2:
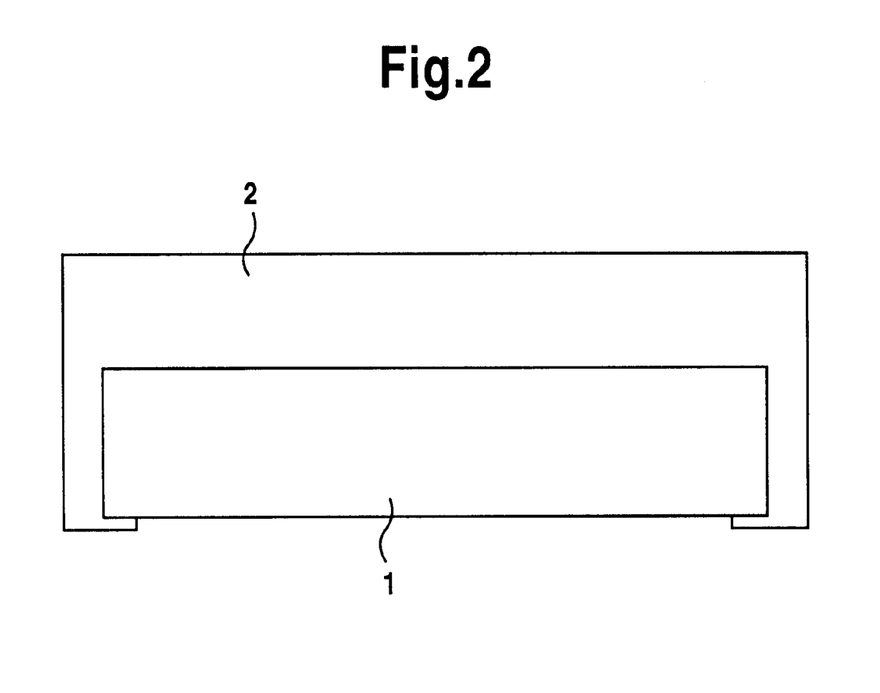
FIG. 2 is a cross-sectional diagrammatic view for explaining the sealing of the hybrid integrated circuit device according to a first modified embodiment of the present invention.
Figure 3:
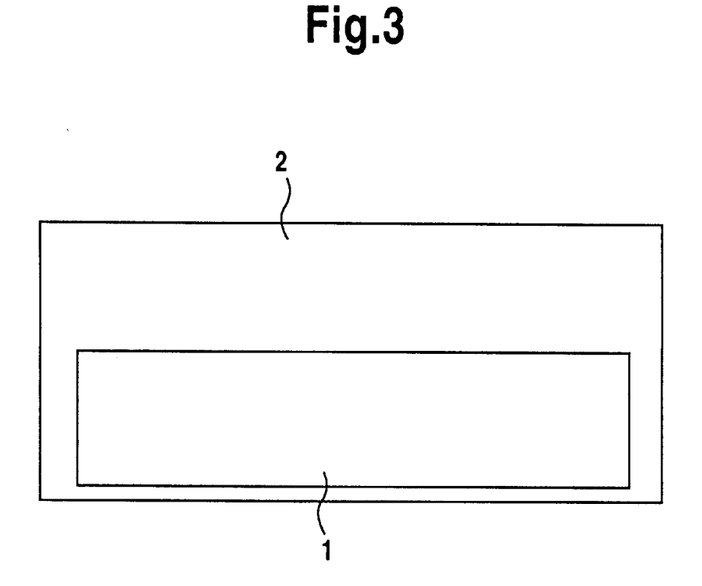
FIG. 3 is a cross-sectional diagrammatic view for explaining the sealing of the hybrid integrated circuit device according to a second modified embodiment of the present invention.
Figure 4:
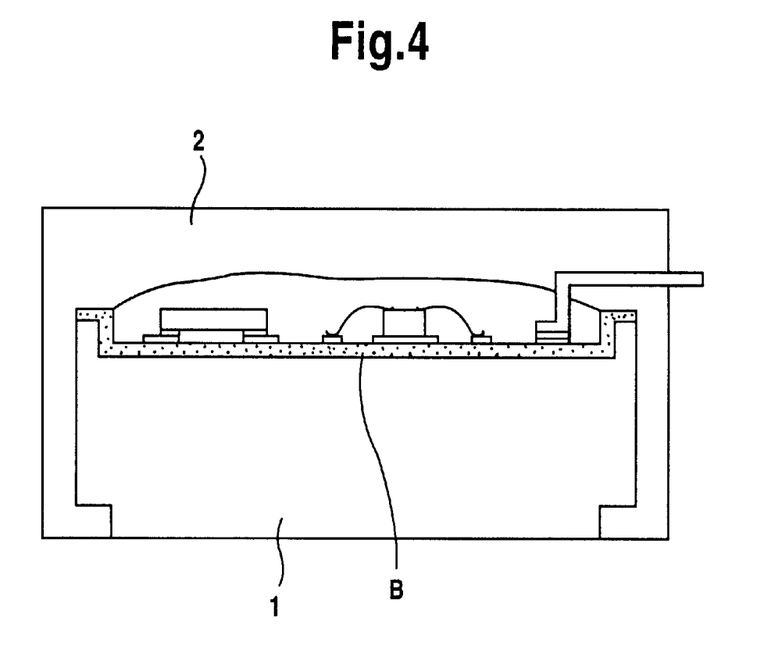
FIG. 4 is a cross-sectional diagrammatic view for describing the sealing of the hybrid integrated circuit device according to a third modified embodiment of the present invention.

FIGS. 2, 3, and 4 describe the sealing structure using a thermoplastic resin respectively. FIG. 2 shows the sealing structure of a first modulated embodiment. In the embodiment, thermoplastic resin is extended to the periphery of the reverse side of the hybrid integrated circuit substrate in order to prevent removal of thermoplastic resin from the substrate, as well as in order to cause the substrate to act as a heat sink. FIG. 3 shows the sealing structure of a second modulated embodiment. In the embodiment, the thermoplastic resin is extended so as to completely seal the entire reverse side of the hybrid integrated circuit substrate in consideration of a short circuit between the hybrid integrated circuit substrate and a member used for mounting the substrate, such as an external chassis. FIG. 4 shows the sealing structure of the third modulated embodiment. In the embodiment, the hybrid integrated circuit board is half pressed to form recess B in order to prevent potting resin from flowing outside the hybrid integrated circuit board, as well as to ensure penetration of thermoplastic resin into the recess.

(1) Injection Mold Time

Epoxy resin used for transfer molding must be left standing during the time period over which the epoxy resin thermally sets in the molds. In contrast, thermoplastic resin requires simple cooling, thereby shortening the mold time.

(2) Resin Yields and Recyclable Characteristics of Resin

Thermosetting resin cannot be recycled. In contrast, thermoplastic resin can be recycled, so long as the resin undergoes heat. Resin yields can be improved by recovering or recycling resin used for runners. Accordingly, resin can be recycled.

(3) Conditions for Injection Molding

Cylinder Temperature: substantially equal to the fusing temperature of resin, i.e., about 290 to 320° C.

Temperature of Molds: about 120 to 170° C. in order to solidify molded resin

Injection Pressure: 50 to 200 Kg/cm$^2$ (4) PPS (Polyphenylene sulfide): one of thermoplastic resins This resin has no hydrophilic group and hence has a coefficient of water absorption half that of epoxy resin. However, PPS resin is inferior to epoxy resin in terms of adhesion with respect to leads or elements.

Figure 6:
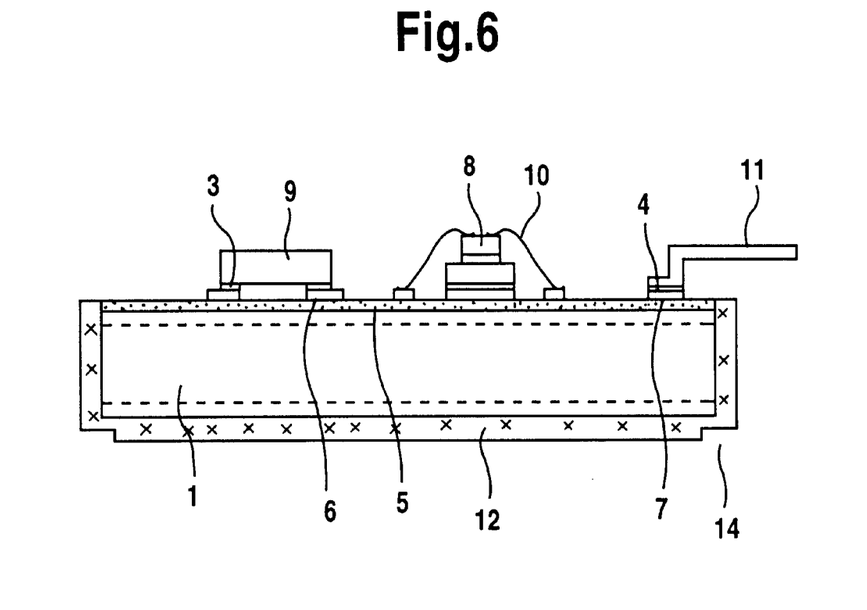
FIG. 6 is a cross-sectional view for describing the relationship between a support member and a hybrid integrated circuit board, both being shown in FIG. 5.
Figure 7:
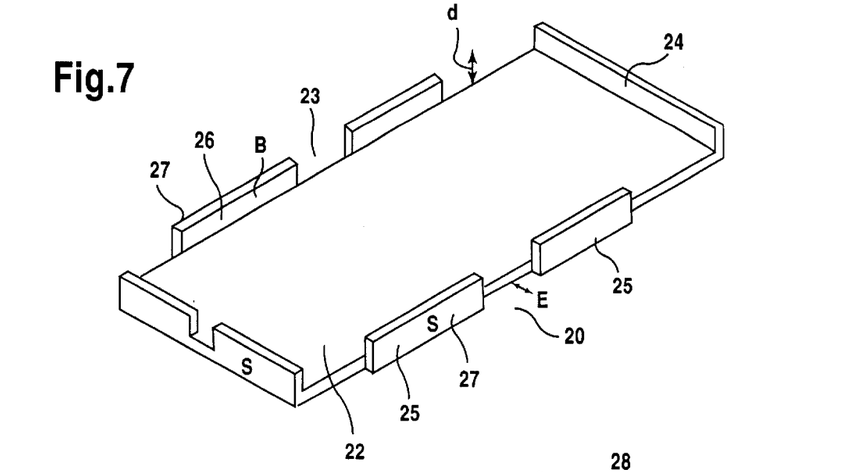
FIG. 7 is a perspective view for describing the support member according to the present invention.
Figure 8:
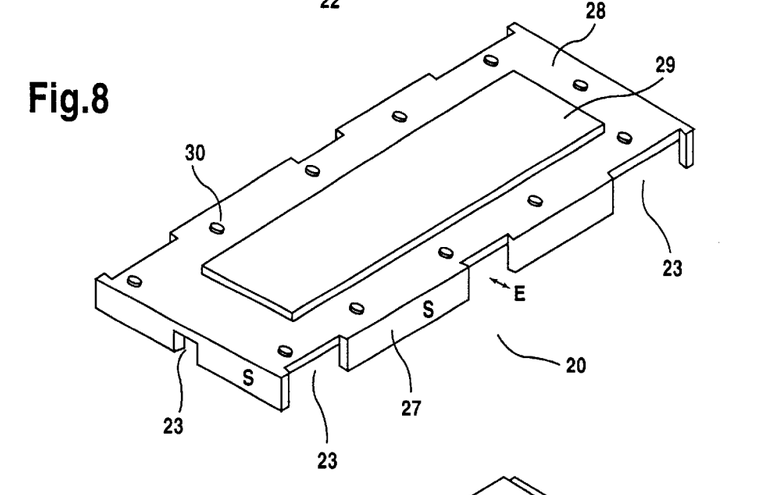
FIG. 8 is a perspective view for describing the support member shown in FIG. 7.
Figure 9:
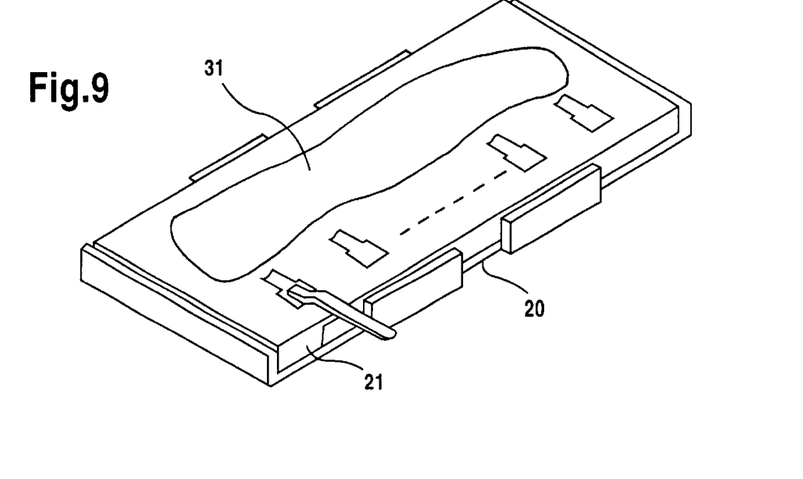
FIG. 9 is a perspective view showing the hybrid integrated circuit board when the board is mounted on the support member shown in FIG. 7.

In the case of a mold such as that shown in FIG. 3, a clearance must be ensured between the reverse side of the hybrid integrated circuit board and the mold in order to permit resin to go around the reverse side of the hybrid integrated circuit board. However, warpage arises in the substrate under injection pressure. According to the test, in a case where pins are provided on the substrate in order to form resin on the reverse side of the substrate to a thickness of 1 mm, the Al substrate having a thickness of 1.5 mm became readily warped. As shown in FIGS. 7 and 8, in order to prevent such warpage, a support member 12 is molded beforehand, and the hybrid integrated circuit board 1 is placed on this support member 12 in the manner as shown in FIGS. 6 and 9. As shown in FIG. 10, the support member 12(20) having the hybrid integrated circuit board 1 mounted thereon is placed in the molds, and the hybrid integrated circuit board 1 is again molded with the thermoplastic resin 2. The thus-poured high-temperature thermoplastic resin 2 comes into contact with the support member 12, and the surface of portions of the support member 12 that have come into contact with the resin 2 are fused. Consequently, the hybrid integrated circuit board 1 can be fully molded until the reverse side of the substrate is covered with the resin 2.

Second Embodiment

Figure 5:
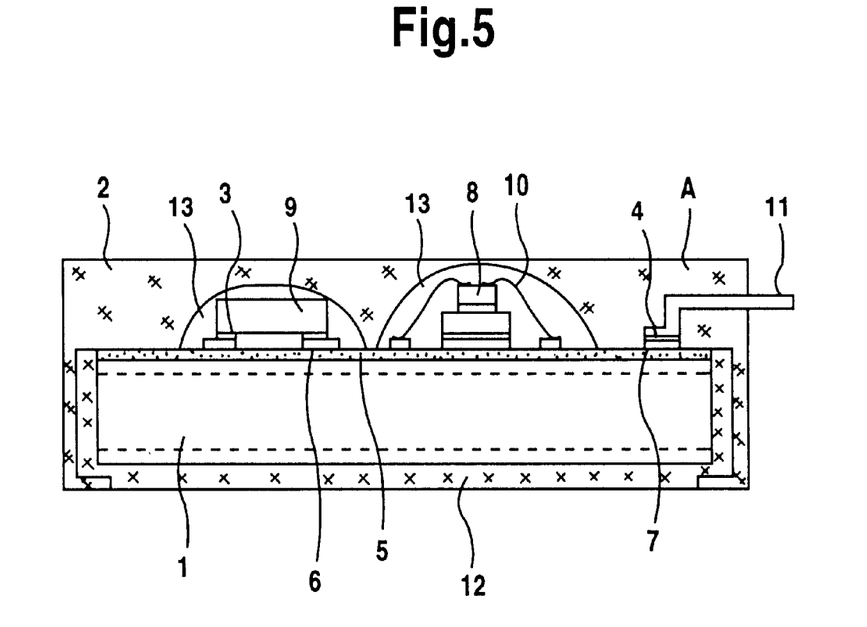
FIG. 5 is a cross-sectional view showing a hybrid integrated circuit device according to a second embodiment of the present invention.

A hybrid integrated circuit device according to a second embodiment of the present invention will be described hereinbelow by reference to FIGS. 5 and 6.

FIG. 6 shows the hybrid integrated circuit board 1 incorporated into the support member 12. FIG. 5 shows the hybrid integrated circuit board shown in FIG. 6 while the board is placed in molds and is molded with thermoplastic resin. Ceramic, metal, a printed board, a glass board, and a flexible sheet can be considered to be the hybrid integrated circuit board. The following description explains the second embodiment while using an aluminum substrate as the metal substrate.

In the second embodiment, a metal substrate or an insulating substrate—whose thermal conductivity is close to that of the metal substrate—is employed as the hybrid integrated circuit board 1. The reason for this will be described in detail later. Since the thermoplastic resin 2 employed in the present invention is injected at a high temperature, the temperature of the substrate increases in the molds. For example, if a metal substrate is employed, the substrate acts as a heat sink and prevents an increase in the temperature of the hybrid integrated circuit board 1 and fusing of the solder joints 3 and 4.

Further, a metal substrate made of Cu, Fe, Al, a compound including Cu, Fe, Al having superior conductivity or a ceramic substrate can be considered to be a substrate.

The surface of the Al substrate 1 is anodized to form a metal oxide, and the resin 5 having a superior insulating characteristic is placed over the entire surface of the Al substrate 1. If there is no need to take into account a withstand voltage, the anodized oxide may be omitted.

The conductor patterns 6 and 7 are formed from, e.g., Cu, on the resin 5. Further, the active element 8 (a bare chip in the second embodiment), such as a transistor or an IC, and the passive elements 9, such as chip resistors or chip capacitors, are mounted on the conductor patterns 6 and 7 by way of solder, thereby implementing a given circuit. Portions of the elements may be electrically connected by means of a silver paste instead of solder. Further, in a case where the active element 8 is mounted on the substrate 1 while facing up, the element 8 is connected through bonding by way of the fine metal wires 10. Further, the outer leads 11 are connected to the substrate 1 by way of the solder joint 4 until they project outside of the thermoplastic resin 2. In a case where the hybrid integrated circuit board is used for an IC card or the like, the outer leads will be omitted.

The thermoplastic resin 2 for sealing purpose is formed by, e.g., injection molding, and is injected at a very high temperature of about 300° C. In a case where the hybrid integrated circuit board 1 having circuit elements mounted thereon by solder is inserted into molds and is integrally molded, the solder may be fused by the high-temperature resin, which in turn cause solder failures. Particularly, such a problem noticeably arises in a substrate having a low thermal conductivity, such as a resin-based printed board. In contrast, a substrate having a high thermal conductivity is employed in the present invention, the substrate has superior heat dissipation characteristics and acts as a heat sink. Consequently, the substrate prevents an increase in the surface temperature of the substrate, thereby eliminating a problem such as that mentioned above. In this embodiment, a material of polyphenylene sulfide (PPS) is used as the thermoplastic resin. The Al substrate is formed to a thickness of 1.5 mm.

The temperature of the molds is considerably lower than that of molds used for transfer molding. More specifically, the molds has a temperature of about 130° C. or less. When liquid resin having a temperature of 300° C. is poured into the molds, the resin is quickly cooled by means of the molds having a lower temperature. It takes about 10 to 20 seconds or thereabouts to cool the resin. Compared with a time period required for transfer molding (e.g., 30 to 180 seconds), the time period can be considerably reduced.

In a case where the hybrid integrated circuit board 1 having circuit elements mounted thereon is molded with the thermoplastic resin 2, the solder joins 3 and 4, bonding wires, and a bare chip should preferably be potted beforehand by means of thermosetting resin 13 (e.g., epoxy resin) (potting step). Preferably, the thermosetting resin has the same coefficient of thermal expansion as that of the hybrid integrated circuit board 1.

According to the countermeasures of adding the potting step, have the effect of particularly preventing tilting of fine wires (having a diameter of less than 100 μm) under the pressure at which the hybrid integrated circuit board is molded with thermoplastic resin through injection molding, as well as the effect of preventing a break in the wires. The thermoplastic resin 2 is brought solely into close contact with the hybrid integrated circuit board 1 after molding of the board and does not adhesively react with the substrate 1. Therefore, when the thermoplastic resin 2 is in direct contact with the circuit elements, thermal shock causes stress in solder joins and wire joints including fine and thick wires, because of a mismatch of thermal expansion coefficient between the thermoplastic resin 2 and the components 8 and 9 mounted on the hybrid integrated substrate and a mismatch of thermal expansion coefficient between the hybrid integrated substrate 1 and the thermoplastic resin 2, thereby causing a break in wires. These problems can be solved by means of the potting resin 13. Preferably, the potting resin 13 is thermosetting epoxy resin, and thermoplastic resin is not preferable as the potting resin. As mentioned previously, the thermoplastic resin 2 is solely in close contact with the hybrid integrated circuit board 1 and does not react with a material to be sealed. If the substrate 1 becomes warped by means of, e.g., thermal shock, and the wires are pulled, the wires cause slippage and result in a break, because the wires do no adhesively react with the material to be sealed. However, resin, such as epoxy resin, which reacts with a material to be sealed are bonded to the wires through chemical bonding reaction, so that wires do not cause slippage in the epoxy resin. Further, the thermoplastic resin 2 does not directly come into contact with solder during molding operations, and hence an increase in the temperature of solder can be prevented. As mentioned previously, in a case where a metal substrate is employed, the substrate acts as a heat sink. If solder is coated with resin, solder can be prevented from being fused more thoroughly. Further, even in the case of a printed or ceramic board having inferior conductivity, solder can be prevented from being fused by coating solder with resin and by controlling the thickness of the resin and the temperature at which the resin is injected. Basically, thermoplastic resin can be injection-molded through use of all the possible substrates.

There is a known phenomenon in which that solder joins of the outer leads 11 do not cause any failures as a result of a heating operation even when resin is not potted, but the cause of the phenomenon is unknown. This phenomenon is considered to be attributable to that, as a result of transfer of heat to the outside of the outer leads, solder is prevented from being fused, that L-shaped engagement of resin with the substrate in area A prevents the displacement of resin from the substrate, or that the outer leads have the effect of preventing removal of resin (i.e., an anchoring effect). More specifically, in a case where joints, bonding wires, and a bare chip are partially potted, potting of leads may be omitted by virtue of the foregoing effect. However, in a case where resin is applied to the entire surface of the substrate, potting may not be omitted in terms of workability.

Further, as is obvious from FIG. 6, a step 14 is formed along the periphery of the reverse side of the hybrid integrated circuit board 1 in order to improve adhesion between the substrate and thermoplastic resin poured into the molds.

Third Embodiment

A third embodiment of the present invention will now be described. FIGS. 7 and 8 are perspective views of the support member 20 when viewed from the topside and underside. As in the case of FIG. 6, FIG. 9 shows a hybrid integrated circuit board 21 mounted on the support member 20.

The support member 20 is like a wood case having no closure. Notches 23 are partially formed in the side surfaces of the support member 20 other than a bottom surface 22 so that resin can penetrate to the bottom surface of the support member 20 when thermoplastic resin is poured into the support member by means of molds, which will be described later.

As shown in FIG. 7, the four sides of the support member 20 may be formed from either a side surface 24 or a side surface 25 having the notch 23. For convenience sake, two types of side surfaces 24 and 25 are shown in the drawing.

An internal side surface 26 (indicated by B) comes into contact with the side surface of the hybrid integrated circuit board 21. More specifically, the side surface has such a dimensional accuracy as to eliminate play between the internal side surface and the hybrid integrated circuit board 21.

Particularly, the side surface acts as only one means for stopping the hybrid integrated circuit board. Any measure may be employed, so long as it can hold the hybrid integrated circuit board on the support member 20. In any event, since resin is injected at high pressure, the stopper must be designed so as to prevent the hybrid integrated circuit board from being removed from the support member 20. As will be described later, a surface 27 (indicated by S) is in contact wit the mold. The side surface 25 assumes a rectangular plate having thickness E. In short, since the notch 23 has a space of width E, resin penetrates to a step 28 shown in FIG. 8.

In contrast, since the support member 20 has the step 14 (corresponding to the step 28) shown in FIG. 6, adhesion between the support member 20 and poured resin is improved. However, when the support member 20 is fitted to the molds, and resin is poured into the support member 20, the support member 20 formed from thermoplastic resin becomes warped because of presence of the clearance formed by the step. To prevent such warpage, projections which are flush with a reverse side 29, i.e., warpage prevention means 30, are provided on the entire surface of the step 28. The size and shape of and the number of projections are arbitrarily determined in consideration of the dimension of the hybrid integrated circuit device and injection pressure.

FIG. 9 shows a hybrid integrated circuit board 21 attached to the support member 20. Reference numeral 31 designates potting resin for purposes of preventing fusing of solder, a break in fine metal wires, and warpage.

Figures 11A, 11B:
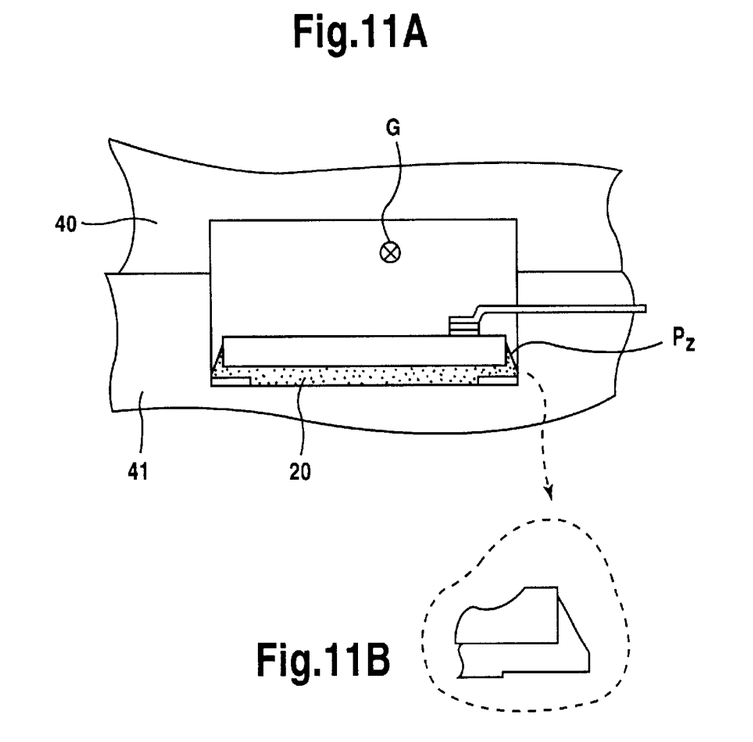
FIG. 11(A) is a fragmentary cross-sectional and FIG. 11(B) is a partially enlarged view for describing line contact between the support member and the molds.

Subsequently, with reference to FIGS. 10 and 11(A) and 11(B), there is described the support member 20 having the hybrid integrated circuit board 21 mounted thereon is attached to molds 40 and 41. FIG. 10 shows the surfaces S of the side surfaces 24 and 25 of the support member 20 are in surface contact with the mold 41. FIGS. 11(A) and 11(B) show the surfaces S of the side surfaces 24 and 25 are in substantially line contact with the mold 41. In view of strength, surface contact is superior to line contact. For this reason, as indicated by a dotted line in FIG. 11(B), the portion of the side surface to be brought into line contact with the mold may be chamfered so as to have a trapezoidal cross section. Alternatively, the side surface may be brought into point contact with the mold. Particularly, the shape of the side surface shown in FIG. 11(B) is determined in consideration of moisture resistance. The thermoplastic resin entered from an injection port (gate G) come into tilt contact with the support member 20 along moisture path P2. In short, moisture path P1 (referring to FIG. 10) is extended to moisture path P2 (referring to FIG. 11(A)), thereby improving the moisture resistance of the support member. Symbol X represents the gate, and the circle enclosing X represents the flow of resin from back to front of the drawing sheet.

In FIGS. 6 and 7, substantially semi-spherical protuberances may be formed on the side surfaces 24 and 25 of the support member 20 to establish point contact with the mold. In such a case, when thermoplastic resin is poured into the molds and the support member 20 is molded in the manner such as shown in FIG. 5, the support member 20 is in point contact with the mold. Therefore, compared with the support member which is in surface or line contact with the mold, an exposed area of the support member becomes much smaller.

Figure 12:
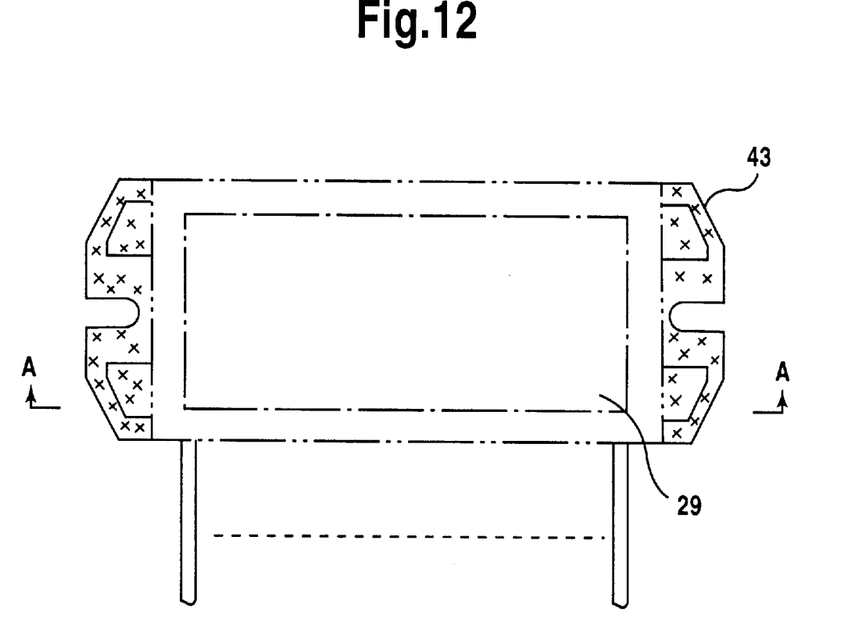
FIG. 12 is a schematic representation for describing the hybrid integrated circuit device.
Figure 13:
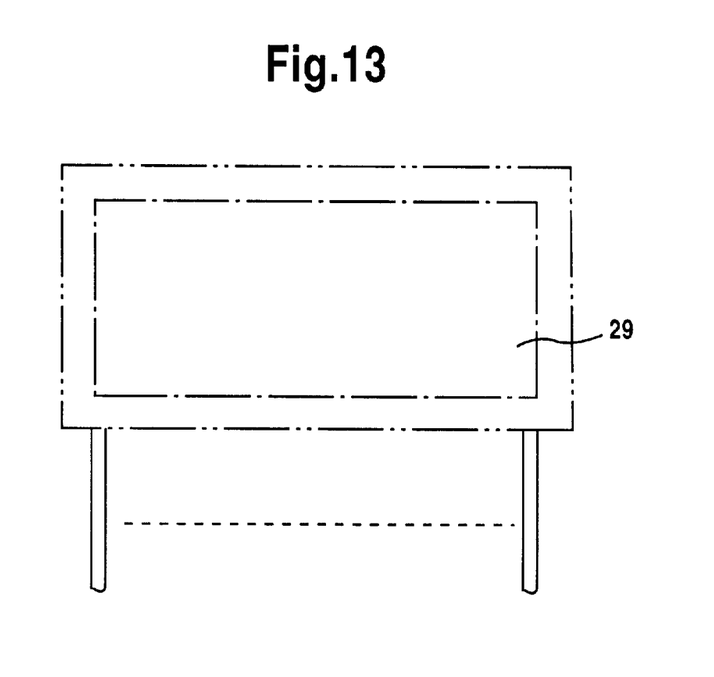
FIG. 13 is a schematic representation for describing the hybrid integrated circuit device.

FIGS. 12 and 13 are general views showing the support member attached to molds when the support member is integrally molded by injection of resin. FIG. 12 shows a brim 43 made of thermoplastic resin so that screws can be fitted into the areas hatched by symbol X. Further, a dashed line indicates an exposed portion of the reverse side of the support member 20. FIG. 13 also shows the support member while the brim 43 is omitted, and the dashed line shows an exposed portion of the reverse side of the support member 20.

Figure 14:
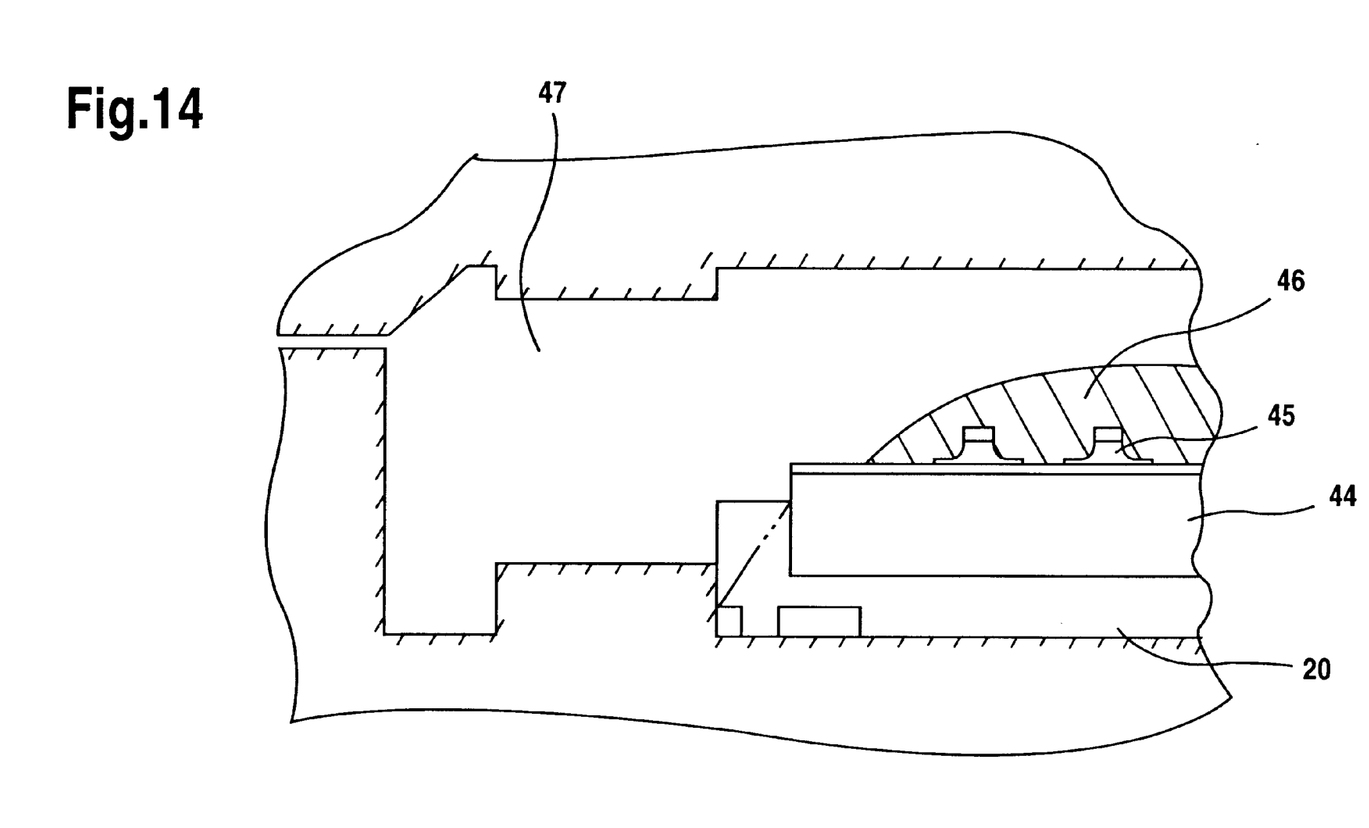
FIG. 14 is an enlarged fragmentary cross-sectional view for describing the sealing method employed in FIG. 12.

FIG. 14 is a cross-sectional view taken along line A—A shown in FIG. 12, showing the fitting of the support member into the molds. Reference numeral 20 designates a support member; 44 designates a hybrid integrated circuit board; 45 designates outer leads; 46 designates potting resin; and 47 designates a space in which the brim 43 is formed. A three-dot chain line designates an area which may be cut so as to improve the moisture resistance of the support member 20, as in the case of the moisture path P2 shown in FIG. 11(A).

Finally, fillers for improving thermal conduction may be mixed into the support member 20 in consideration of a rise in the temperature of the hybrid integrated circuit board resulting from injection of the resin 2. This applies to the first through third embodiments. For example, in the third embodiment, alumina or Si is mixed into the support member. Further, when an attempt is made to integrally mold the support member and the hybrid integrated circuit board within the molds, heat may be absorbed by the molds having superior heat conduction during the molding operation, thus preventing transfer of heat over the entire surface of the reverse side of the hybrid integrated circuit board. Accordingly, it is important to prepare the support member beforehand. Further, for the foregoing reasons, thermoplastic resin which does not contain high high-conduction fillers may be used as the resin 2 to be injected. If the molds deprive of the heat of the injected resin 2, the resin 2 will be solidified at any points along the way to the hybrid integrated circuit board. However, under the molding method according to the present invention, the resin of the support member is selected while placing emphasis on thermal conductivity, and resin to be injected is determined while putting emphasis on moldability.

As has been described above, according to the first aspect of the present invention, there is employed a metal substrate or a substrate having superior heat conductivity which prevents an increase in the surface temperature of the substrate by dissipation, to the outside of the circuit, of the heat of injected mold or by collection of the heat into a heat sink. As a result, thermoplastic resin which requires a short period of molding process can be adopted.

According to the second aspect of the present invention, circuit elements electrically connected to a hybrid integrated circuit board by way of solder are potted with protective resin for heat protection purpose. As a result, even when thermoplastic resin which is injected at a high temperature is used, mount failures can be prevented from arising in the hybrid integrated circuit board.

According to the third aspect of the present invention, the protective resin is provided with a coefficient of thermal expansion which is substantially equal to that of the hybrid integrated circuit board, thereby eliminating a mismatch of thermal expansion coefficient between the protective resin and the hybrid integrated circuit board and reducing mount failures.

According to the fourth aspect of the present invention, protective resin is applied over substantially the entire surface of the hybrid integrated circuit board, and the hybrid integrated circuit board is sealed with the thermoplastic resin so as to cover the protective resin. Compared with partial potting of protective resin, application of protective resin over the entire surface of the hybrid integrated circuit board can be improved in terms of workability.

According to the fifth aspect of the present invention, when the hybrid integrated circuit board connected to circuit elements by way of solder is molded with thermoplastic resin, a metal substrate is used as the hybrid integrated circuit board in order to dissipate or store the heat of injected thermoplastic resin. As a result, fusing of solder can be prevented.

According to the sixth aspect of the present invention, the hybrid integrated circuit board is provided with a sealing member which is formed from thermoplastic resin and is integrated with the support member as a result of an exposed portion of the support member. As a result, the hybrid integrated circuit board is molded and integrated with the support member with injected thermoplastic resin, so that the reverse side of the hybrid integrated circuit board is prevented from being exposed. Accordingly, the withstand voltage characteristics and moisture resistance of the hybrid integrated circuit board are improved.

According to the seventh aspect of the present invention, the hybrid integrated circuit board comprises a support member which has at least stoppers along opposing side surfaces of the support member or a groove for the purpose of locking a substrate and which is made of thermoplastic resin. As a result, even when resin is injected at high pressure, the hybrid integrated circuit board can be prevented from being displaced.

According to the eighth aspect of the present invention, semiconductor elements and/or passive elements are electrically connected to conductor patterns by means of solder, and insulating resin is applied to the surface of the solder, thereby preventing fusing of solder, a break in fine metal wires, and warpage in the substrate.

According to the ninth aspect of the present invention, application of the insulating resin to the solder provided on the outer leads can be omitted, thereby simplifying manufacturing processes.

According to the tenth aspect of the present invention, the hybrid integrated circuit board has the sealing member which is formed from thermoplastic resin and is integrated with the support member as a result of exposed portions of the support member being fused. The hybrid integrated circuit board is molded and integrated with the support member with the injected thermoplastic resin, thereby preventing the reverse side of the hybrid integrated circuit board from becoming exposed. Consequently, the withstand voltage characteristic and moisture resistance of the hybrid integrated circuit are improved, and warpage in the support member, which would otherwise be caused by heat or injection pressure, can also be prevented.

According to the eleventh aspect of the present invention, projecting warpage prevention means are provided on the step along the periphery of the reverse side of the support member, thereby ensuring engagement between the resin and the support member and preventing warpage in the reverse side of the support member.

According to the twelfth aspect of the present invention, the hybrid integrated circuit board has the sealing member which is formed from thermoplastic resin and is integrated with the support member as a result of exposed portions of the support member being fused. The hybrid integrated circuit board is molded and integrated with the support member with the injected thermoplastic resin, thereby preventing the reverse side of the hybrid integrated circuit board from becoming exposed. Consequently, the withstand voltage characteristic and moisture resistance of the hybrid integrated circuit are improved. Further, since the hybrid integrated circuit board has the support member which is formed from thermoplastic resin and has at least stoppers for locking the substrate, the hybrid integrated circuit board can be prevented from being displaced when resin is injected at high pressure.

According to the thirteenth aspect of the present invention, so long as the stopper means is arranged so as to make line or point contact with the molds, there is formed a moisture path such as path P2 shown in FIG. 7, thereby improving the moisture resistance of the hybrid integrated circuit board.

What is claimed is:

1. A hybrid integrated circuit device comprising:
    a substrate having an insulated surface and high thermal conductivity;
    conductor patterns provided on the substrate;
    an element mounted on the surface so as to connect with the conductor patterns through electrically connecting means;
    an outer lead which is electrically connected to the conductor patterns and is extended outwardly; and
    a sealing member of thermoplastic resin so as to be molded and cover at least the surface of the substrate.

2. The hybrid integrated circuit device according to claim 1, wherein the electrically connecting means is a solder and the element is electrically connected to the conductor patterns through the solder.

3. The hybrid integrated circuit device according to claim 1, wherein at least the electrically connecting means is covered with protective resin.

4. The hybrid integrated circuit device according to claim 3, wherein the protective resin is thermosetting resin.

5. The hybrid integrated circuit device according to claim 4, wherein the protective resin has substantially the same thermal expansion coefficient as that of the substrate.

6. The hybrid integrated circuit device according to claim 1, wherein the thermoplastic resin is PPS resin.

7. The hybrid integrated circuit device according to claim 1, further comprising:

a support member of thermoplastic resin on which the substrate is mounted; and the sealing member is in contact with the support member so that a contacted portion of the sealing member is fused and integrated with the support.

8. The hybrid integrated circuit device according to claim 7, wherein the support member has an engaging member so as to fix the substrate.

9. The hybrid integrated circuit device according to claim 1, wherein the outer lead is connected with the conductor pattern through a solder.

10. The hybrid integrated circuit device according to claim 2, wherein a fusing temperature of the solder is not higher than 180° C.

11. The hybrid integrated circuit device according to claim 7, wherein a step is formed at a peripheral portion of the bottom of the support member, and the sealing member is extended to a part of the reverse side of the substrate.

12. The hybrid integrated circuit device as defined in claim 11, wherein the step is provided along the entire periphery of the reverse side of the support member, and projections are provided on the step so as to be same level as the bottom of the support member.

13. The hybrid integrated circuit device according to claim 7, wherein a plurality of projected members are provided on a side surface of the support member so that the substrate is fixed with inner side of the projected members and outer side of the projected members is contacted with a mold while molding; and the sealing member is formed so as to cover the side.

14. The hybrid integrated circuit device according to claim 4, wherein setting temperature of the thermosetting resin is within a range of 280±° C.

15. The hybrid integrated circuit device according to claim 1, wherein a reinforced fiber is poured in a horizontal direction of the hybrid integrated circuit board.

16. The hybrid integrated circuit device according to claim 1, wherein a fusing temperature of the solder is within a range between about 180 to 250° C.

* * * * *